(12) United States Patent
Ware

(10) Patent No.: US 6,782,459 B1
(45) Date of Patent: Aug. 24, 2004

(54) METHOD AND APPARATUS FOR CONTROLLING A READ VALID WINDOW OF A SYNCHRONOUS MEMORY DEVICE

(75) Inventor: Frederick A. Ware, Los Altos Hills, CA (US)

(73) Assignee: Rambus, Inc., Los Altos, CA (US)

(*) Notice: Subject to any disclaimer, the term of this patent is extended or adjusted under 35 U.S.C. 154(b) by 713 days.

(21) Appl. No.: 09/638,562

(22) Filed: Aug. 14, 2000

(51) Int. Cl.[7] .............................. G06F 12/00; G06F 1/04
(52) U.S. Cl. ...................... 711/167; 713/400; 713/500; 710/38
(58) Field of Search ................................. 711/167, 168, 711/169, 105; 713/400, 401, 500, 501, 502, 503, 600; 710/38

(56) References Cited

U.S. PATENT DOCUMENTS

| | | | |
|---|---|---|---|
| 5,768,624 A | | 6/1998 | Ghosh |
| 5,909,701 A | | 6/1999 | Jeddeloh |
| 6,199,135 B1 | * | 3/2001 | Maahs et al. ................ 710/305 |
| 2001/0039602 A1 | * | 11/2001 | Kanda et al. ................ 711/105 |

OTHER PUBLICATIONS

Dr. Jake Baker, "*DDR SDRAM Functionality And Controller Read Data Capture*", vol. 8, Issue 3, third quarter 1999, pp. 1–24.

Steven A. Przybylski, "*New DRAM Technologies—A Comprehensive Analysis Of The New Architectures*", MicroDesign Resources, 1994, pp. iii–xiv, pp. 119–203.

International Search Report for PCT/IB01/01782.

* cited by examiner

Primary Examiner—Matthew D. Anderson
(74) Attorney, Agent, or Firm—McDonnell Boehnen Hulbert & Berghoff LLP

(57) ABSTRACT

A method and apparatus are shown for increasing a propagation delay that may be tolerated between a memory controller and a memory device. The present invention provides for selection between two data paths for each word, where a first data path latches the data word from a DQS domain on a falling edge of a CLK0 domain and a second data patch latches the data word from the DQS domain on a rising edge of the CLK0 domain. Selection of the first data path permits larger relative propagation delays between the controller and memory to be accommodated without loss of data. Further, multi-cycle source synchronous timing logic may be employed that provides for the capture of data words on rising and falling edges of successive cycles of the DQS domain and storage for an additional cycle of the DQS domain to extend the period of time that each data word from the DQS domain is available and valid for the CLK0 domain. Selection of the first data path may also be used to accommodate shorter relative propagation delays between the controller and memory without loss of data when the propagation delay is short enough that the data from the memory is valid in advance of a first falling edge of the CLK0 domain by a margin that is at least a set-up time interval for the controller.

20 Claims, 11 Drawing Sheets

METHOD AND APPARATUS FOR CONTROLLING A READ VALID WINDOW OF A SYNCHRONOUS MEMORY DEVICE

FIELD OF INVENTION

The present invention relates to memory devices. More specifically, it relates to a read valid window of a synchronous memory device.

BACKGROUND OF THE INVENTION

Computer systems generally include a memory subsystem that contains memory devices where instructions and data are held for use by a processor of the computer system. Because the processor is typically capable of operating at a higher rate than the memory subsystem, the operational speed of the memory subsystem has a significant impact on the performance of the computer system.

In the past, the memory devices making up the memory subsystem, such as Dynamic Random Access Memory (DRAM), were typically asynchronous devices, i.e. the memory devices stored or output data in response to control signals from the processor. However, asynchronous operation results in a delay between the time that a control signal, e.g. a read command and address value, is received by the memory device and the time that the device responds, e.g. the data becomes available at the output of the memory device. This delay between the reception of a control signal and the device response typically lasts for several operational cycles of the processor. During the delay, the processor is typically unable to perform useful functions and the operational cycles are consequently wasted.

To avoid wasting operational cycles while waiting for a response from memory, synchronous memory devices, such as synchronous DRAM (SDRAM), have been developed. SDRAM exploits the fact that most memory accesses are sequential and is designed to fetch data words in a burst as fast as possible. SDRAM typically operates by outputting a sequence, or "burst"of several words or bytes of data in response to a single control signal from the processor. For example, a burst cycle, such as 5-1-1-1, consists of a sequence of four data word transfers where only the address of the first word is supplied via the address bus input to the memory device. The 5-1-1-1 refers to the number of clock cycles required for each word of the burst. In this example, the first word is available at the output of the data device at five clock cycles after the input cycle of the command signal and another word is output by the memory device at each subsequent clock cycle to complete the burst.

An SDRAM device typically employs a memory controller through which the processor accesses the DRAM memory cells. When the memory controller receives a data request from the processor, it accesses the rows and columns of the DRAM memory array to access the data and must wait for the data to become available from the DRAM memory array before sending it to the processor. With SDRAM a burst counter in the controller typically allows the column part of the memory address to be incremented very rapidly, which helps speed up retrieval of information in sequential reads considerably. The controller synchronizes the timing of the memory system to the processor's system clock in order to supply the data words to the processor as fast as the processor can take them. Note that for synchronous memory schemes to function properly, the data words from the DRAM cells must be available and valid at, typically, the rising edge of each clock cycle.

Another approach that has been developed to improve memory performance is called double data-rate (DDR), such as is available in DDR DRAM devices. In a DDR DRAM, data during a burst is output on both the rising and falling edge of the clock cycles, which effectively doubles the rate of operational frequency of the memory subsystem.

However, in DDR, a data word must be available and valid from the data cells of the memory at both the rising and falling edge of the clock signal driving the memory system. The effect of this is that the performance of the memory subsystem becomes very sensitive to the round-trip delay between the controller and memory.

FIG. 1 is a functional block diagram of a memory architecture 10 that illustrates an example of a DDR memory controller 20 according to the conventional art. Memory controller 20 contains a clock generation circuit 22 that generates a clock zero signal CLK0. The CLK0 drives an even clock domain zero register 24 and an odd clock domain zero register 26. The CLK0 signal is also output to a DDR DRAM block 90 and arrives at the clock input (CLK) of the DDR DRAM device after a propagation delay time interval $t_{PD}$, as represented in FIG. 1 by block 92.

DRAM device 90, in turn, generates a data output signal at output DQ after a output to clock delay interval $t_{DQCK}$, which experiences another propagation delay $t_{PD}$ represented by block 94 and which results in a delayed data signal DQ1 arriving at the memory controller 20. After a clock to output delay interval $t_{DQSCK}$, DRAM device 90 also outputs a data output synchronize signal DQS that is also delayed by propagation delay interval $t_{PD}$, as represented by block 96, and results in a delayed version of the DQS signal called DQS1 that is input to the controller 20.

The DQ1 and DQS1 signals are received by a DQS domain circuit 70 of the controller 20. The DQ1 signal is input to sample and hold registers 74 and 76. The DQS1 signal enters $t_1$ delay circuit 72, which results in delayed signal DQS2. The rising edge of the DQS2 signal drives sample and hold register 74 and a falling edge of the DQS2 signal drives sample and hold register 76, which latch even and odd data words, respectively, of the DQ1 signal.

After a data valid time interval $t_V$, sample and hold register 74 generates data signal DQ2 which is input to even clock zero domain register 24, which is clocked on a rising edge of the CLK0 signal generated by clock generation circuit 22. Also, after data valid interval $t_V$, sample and hold register 76 outputs a delay data signal DQ3 to odd clock zero domain register 26 which is clocked on the falling edge of the clock zero signal.

In the conventional device shown in FIG. 1, the data from the DQ output of the DDR DRAM device 90 must typically be available and valid at the input of the even clock zero domain register 24 within a single clock cycle interval $t_{cc}$ in order for the memory controller to make the data available at the appropriate time the processor to read the data word.

FIG. 2 is a timing diagram illustrating an example of the function of controller FIG. 1 and illustrating the effect of the delay in the circuit in FIG. 1 on the setup time $t_s$ for the even and odd clock zero domain register 24 and 26. Measured from a rising edge of the CLK0 signal generated by clock zero register circuit 22, a first propagation delay interval $t_{PD}$, represented in FIG. 1 as delay 92, is received in DRAM device 90 at clock input CLK. From the time that the delayed CLK0 signal is received at the CLK input of DRAM device 90 to the time that the DQS signal is output involves a delay $t_{DQSCK}$. The DQS signal is then delayed by another propagation delay interval, represented in FIG. 1 as delay 96, that results in the DQS1 signal that is received by DQS circuit 70. The DQS1 signal, in turn, is delayed by time interval $t_1$ by delay element 72, which results in the DQS2 signal. The delay element 96 introduces delay $t_1$ so that the DQ1 signal meets the set-up time requirements for registers 74 and 76.

The set-up time for registers 74 and 76 can be derived from the formula $$t_{Smin} <= t_{1min} + (t_{DQSCKmin} - t_{DQCKmax})$$

which, inserting typical values, produces 0.2 ns$<=t_{1min}-$0.5 ns, which, in turn, yields, 0.7 ns$<=t_{1min}$. The hold time for registers 74 and 76 can be derived from the formula $$t_{Hmin} <= t_{CHmin} + (t_{DQCKmin} - t_{DQSCKmax}) - t_{1max}$$

where $t_{CHmin}$ is the minimum clock high cycle time, which is typically one third of the clock cycle $t_{cc}$. Inserting typical values, this formula produces 0.2 ns$<=$2.5 ns$-$0.5 ns$-t_{1max}$, which, in turn, yields 1.8 ns$<=t_{1max}$.

From the rising edge of the DQS2 signal to the time that the data signal DQ2 is valid at the output of sample and hold register 74 of FIG. 1, is represented by the delay $t_V$. Subtracting the sequence of time delays from the total available time for a single clock cycle period $t_{cc}$ for setup of the even and odd data output of controller circuit 20, the maximum round trip propagation delay time that can be tolerated for the even and odd clock zero domain register 24 and 26 can be obtained and is shown in the following equation (1).

$$t_{S,min} <= t_{CC,min} - t_{PD,max} - t_{DQSCK,max} - t_{PD,max} - t_{1,max} - t_{V,max} \quad (1)$$

By plugging in typical numbers for a clock cycle period of 7.5 nanoseconds (ns) yields:

$$0.2 \text{ ns} <= 7.5 \text{ ns} - t_{PD,max} - 0.75 \text{ ns} - t_{PD,max} - 1.8 \text{ ns} - 0.25 \text{ ns}$$

and $$t_{PD,max} <= 1.75 \text{ ns}.$$

The controller circuit 20 of FIG. 1 also has limitations on the minimal propagation delay due to the minimum hold time required by the even and odd clock zero domain registers 24 and 26. Equation (2) below illustrates the time requirements introduced by the hold time required in order to latch even and odd words of the DQ signal in registers 74 and 76.

$$t_{H,min} <= t_{PD,min} + t_{DQSCK,min} + t_{PD,min} + t_{1,min} + t_{V,min} \quad (2)$$

Plugging in typical values for these time intervals yields:

$$0.2 \text{ ns} <= t_{PD,min} + 0.75 \text{ ns} + t_{PD,min} + 0.7 \text{ ns} + 0 \text{ ns}$$

Which reduces to:

$$0.25 \text{ ns} <= t_{PD,min}$$

Thus, the propagation delay must be in the range of 0.25 ns$<=t_{PD}<=$1.75 ns in order for the memory system to operate correctly. As the size of memory cores, such as that in DRAM device 90, become larger and, therefore, require longer access times, and as clock frequencies become faster, resulting in shorter clock cycles and, therefore, less time available for set-up, this constraint can become a significant problem for memory system design.

Therefore, the need remains for improved ways for handling propagation delay in high performance memory systems.

SUMMARY OF THE INVENTION

In accordance with preferred embodiments of the present invention, some of the problems associated with synchronous memory devices are overcome.

An embodiment of a method, according to the present invention, for transferring data from a first timing domain to a second timing domain, calls for selecting a first mode value when a time delay between the first and second domains is within a first range, selecting a second mode value when the time delay is within a second range, and sending a clock signal from the first timing domain to an asynchronous memory device, the clock signal have a first transition from a first logic state to a second logic state of the clock signal. Responsive to a first transition of the clock signal, the method recites receiving from the memory device a first data signal and a first timing signal. The method also sets forth capturing in the second timing domain a first word of the first data signal responsive to a first transition in the first timing signal from a first logic state to a second logic state. When the first mode value is selected, the method calls for transferring the first word from the second timing domain to the first timing domain at a second transition of the clock signal from the first logic state to the second logic state. When the second mode value is selected, the method sets forth transferring the first word from the second timing domain to the first timing domain at a third transition of the clock signal from the second logic state to the first logic state, where the third transition is subsequent to the second transition.

A further refinement of this embodiment of the method according to the present invention, further sets forth capturing in the second timing domain a second word of the first data signal responsive to a second transition in the first timing signal from the second logic state to the first logic state, capturing in the second timing domain a third word of the first data signal responsive to a third transition in the first timing signal from the first logic state to the second logic state, and capturing in the second timing domain a fourth word of the first data signal responsive to a fourth transition in the first timing signal from the second logic state to the first logic state. The step of, when the first mode value is selected, transferring the first word from the second timing domain to the first timing domain at a second transition of the clock signal is further refined to include transferring the second word from the second timing domain to the first timing domain at the third transition of the clock signal from the second logic state to the first logic state, transferring the third word from the second timing domain to the first timing domain at a fourth transition of the clock signal from the first logic state to the second logic state, where the fourth transition is subsequent to the third transition, and transferring the fourth word from the second timing domain to the first timing domain at a fifth transition of the clock signal from the second logic state to the first logic state, where the fifth transition is subsequent to the fourth transition. The step of, when the second mode value is selected, transferring the first word from the second timing domain to the first timing domain at a third transition of the clock signal is further refined to include transferring the second word from the second timing domain to the first timing domain at the fourth transition of the clock signal, transferring the third word from the second timing domain to the first timing domain at the fifth transition of the clock signal, and transferring the fourth word from the second timing domain to the first timing domain at a sixth transition of the clock signal from the first logic state to the second logic state of the clock signal, where the sixth transition is subsequent to the fifth.

An embodiment of a memory controller for reading data from an asynchronous memory device, according to the present invention, includes clock generation means for generating a clock signal in a first timing domain for output to the asynchronous memory device and second timing domain means for receiving a data output signal and first timing signal from the asynchronous memory device, the second timing domain means being configured to capture a first word of the data output signal responsive to a first transition in the first timing signal from a first logic state to a second logic state of the first timing signal. The memory controller also features a first data path for the first word in the first timing domain for latching the first word from the second timing domain means responsive to a first transition of the clock signal from a first logic state to a second logic state and a second data path for the first word in the first timing domain for latching the first word from the second timing domain means responsive to a second transition of the clock signal from the second logic state to the first logic state, where the second transition of the clock signal is subsequent to the first transition of the clock signal. Finally, the memory controller includes means for selecting the first data path for the first word for output of the first word responsive to a first mode value and selecting the second data path for the first word for output of the first word responsive to a second mode value.

In a further refinement of this embodiment of a memory controller according to the present invention, the second timing domain means is further constructed of means for capturing the first word, a second word, a third word, and a fourth word of the data output signal responsive to a series of four transitions of the first timing signal beginning with the first transition of the first timing signal. This refinement of the memory controller further includes a first data path for the second word in the first timing domain for latching the second word from the second timing domain means responsive to the second transition of the clock signal and a second data path for the second word in the first timing domain for latching the second word from the second timing domain means responsive to a third transition of the clock signal from the first logic state to the second logic state, where the third transition of the clock signal is subsequent to the second transition. This refinement also features a first data path for the third word in the first timing domain for latching the third word from the second timing domain means responsive to the third transition of the clock signal and a second data path for the third word in the first timing domain for latching the third word from the second timing domain means responsive to a fourth transition of the clock signal from the second logic state to the first logic state, where the fourth transition of the clock signal is subsequent to the third transition. The refinement also includes a first data path for the fourth word in the first timing domain for latching the fourth word from the second timing domain means responsive to the fourth transition of the clock signal and a second data path for the fourth word in the first timing domain for latching the fourth word from the second timing domain means responsive to a fifth transition of the clock signal from the first logic state to the second logic state, where the fifth transition of the clock signal is subsequent to the fourth transition. Also includes are means for selecting the first data path for the second word for output of the second word responsive to the first mode value and selecting the second data path for the second word for output of the second word responsive to the second mode value, means for selecting the first data path for the third word for output of the third word responsive to the first mode value and selecting the second data path for the third word for output of the third word responsive to the second mode value, and means for selecting the first data path for the fourth word for output of the fourth word responsive to the first mode value and selecting the second data path for the fourth word for output of the fourth word responsive to the second mode value.

Another embodiment of a memory controller, according to the present invention, for controlling transfer of data from an asynchronous memory device, includes a clock generation circuit configured to generate a clock signal for a first timing domain, where the clock signal is output to the memory device and a second domain circuit configured to receive a data signal and a timing signal from the memory device and, responsive to a first transition of the timing signal, latch and hold a first word of the data signal. A first data path for the first word is configured to latch the first word from the second domain circuit responsive to a first transition of the clock signal from a first logic state to a second logic state of the clock signal. A second data path for the first word is configured to latch the first word from the second domain circuit responsive to a second transition of the clock signal from the second logic state to the first logic state of the clock signal, where the second transition of the clock signal is subsequent to the first transition of the clock signal. The controller also includes a first multiplexor having a first input coupled to the first data path for the first word, a second input coupled to the second data path for the first word, and a control input configured to receive a mode signal and select the first data path for the first word responsive to a first value of the mode signal and select the second data path for the first word responsive to a second value of the mode signal.

The foregoing and other features and advantages of a preferred embodiment of the present invention will be more readily apparent from the following detailed description, which proceeds with references to the accompanying drawings.

BRIEF DESCRIPTION OF THE DRAWINGS

The present invention is described in the context of an embodiment of the invention with reference to the following drawings, wherein.

DETAILED DESCRIPTION OF PREFERRED EMBODIMENTS

The present invention is directed toward a method and apparatus for controlling a read valid window in a synchronous memory device. The present invention permits the sampling point for read data in a memory controller to be adjusted in one half clock cycle increments.

Figure 3:
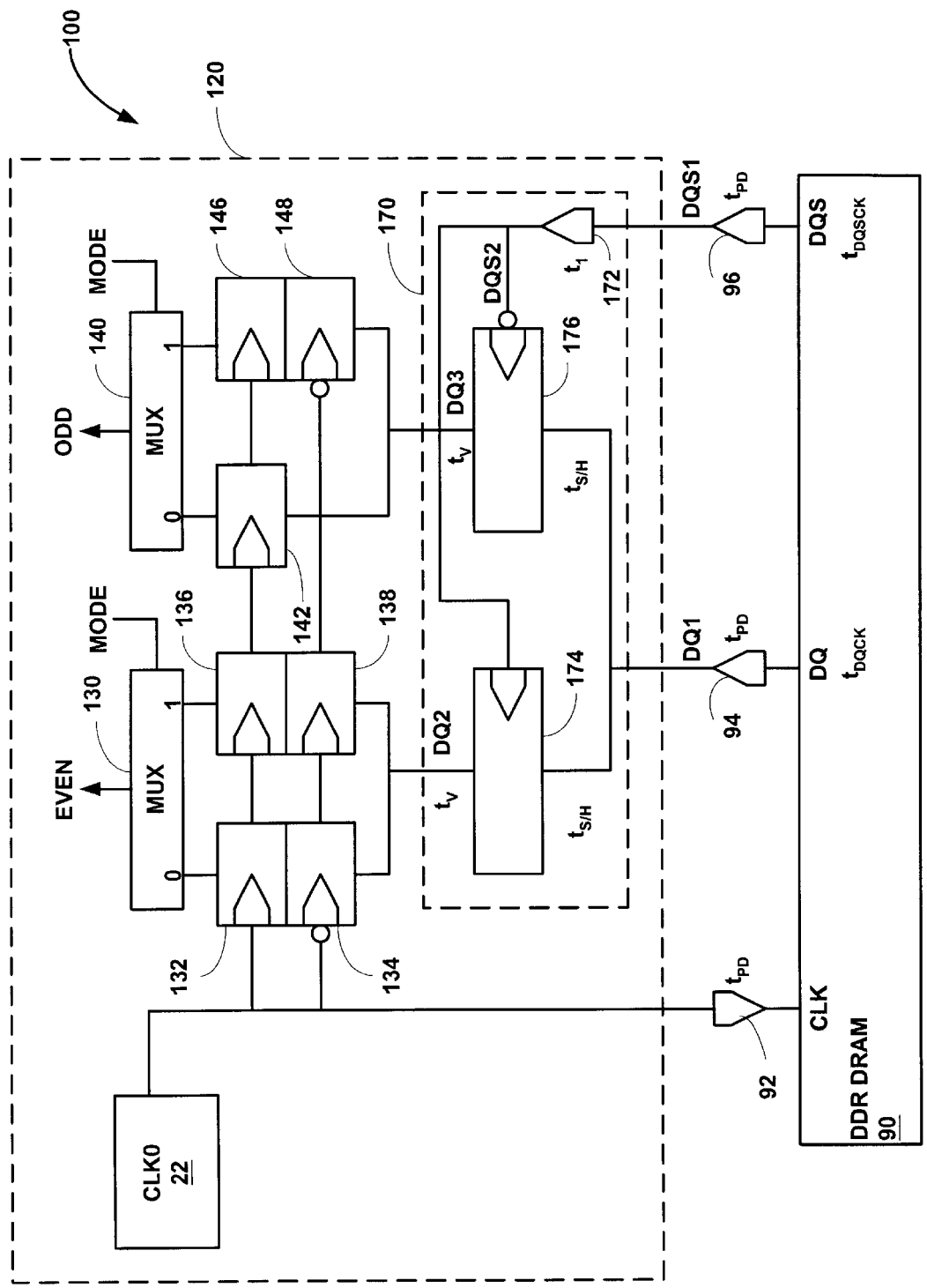
FIG. 3 is a functional block diagram illustrating an embodiment of a controller circuit for a synchronous memory according to the present invention.

FIG. 3 is simplified functional block illustrating an embodiment of a controller circuit 120 for synchronous memory according to the present invention. In controller circuit 120, a first multiplexer (MUX) 130 selects between a first even data path, composed of registers 132 and 134, and second even data path, composed of registers 136 and 138, for capturing and transferring the data of the DQ2 signal to the EVEN output of MUX 130. Similarly, a second multiplexer 140 is used to select between a first odd data path, composed of register 142, and the second odd data path, composed of registers 146 and 148, for capturing and transferring the data of the DQ3 signal to the ODD output of MUX 140.

In the first odd data path for the DQ2 signal, register 134 is driven by the falling edge of the CLK0 signal generated by circuit 22 and the second register 132 is driven by the rising edge of the clock zero signal. Thus, the first even data path captures a word of the odd data signal DQ2 on the first falling edge of the CLK0 signal after a rising edge of the DQS2 signal and transfers the odd data word to MUX 130 on the subsequent rising edge of the CLK0 signal.

In contrast, the second even data path involves both registers 136 and 138 being driven by the rising edge of the clock zero signal. Thus, if the MODE signal controlling MUX 130 is set to logic one (MODE=1), then the odd data word from DQ2 is captured at the rising edge of the CLK0 signal, which is one half of a clock cycle sooner than the first data path that is selected when the MODE signal is set to a logic zero (MODE=0).

Along the same lines, register 142 for the first odd data path is driven by a rising edge of the clock zero circuit and captures an odd data word from the DQ3 signal at the first rising clock edge of the CLK0 signal after a falling edge of the DQS2 signal. The second odd data path involves register 148 being driven by the falling edge of the CLK0 signal while register 146 is driven by the rising edge of the clock zero signal. Therefore, if the second odd data path is selected by MODE=1, then the odd data word is captured one half clock cycle sooner than when MODE=0.

By controlling the value of the MODE signal, the data path for data signals DQ2 and DQ3 can be adjusted in order to accommodate a proportionally greater propagation delay and still allow the controller to perform valid read operations. The addition of selective delay circuitry, MUXes 130 and 140 and associated data paths, to the CLK0 domain of circuit 120 allows the controller to move the sampling points for the data received from DRAM device 90 in increments of one half of a clock cycle. Delay magnitudes on the order of increments of clock cycles may be accommodated by sampling the EVEN and ODD outputs after the appropriate rising edge of CLK0. The present invention will align data to rising CLK0 edges and handle clock domain crossing and data misalignment issues. If, for example, the magnitude of the propagation delay requires an additional clock cycle of delay, then the function of the controller may be modified to sample at $t_6$ instead of $t_4$. Similarly, if two additional clock cycles of delay are required to cope with the magnitude of the propagation delay, then the function of the controller may be modified to sample at $t_8$ instead of $t_6$ or $t_4$. Thus, large propagation delays may be accommodated.

Figure 1:
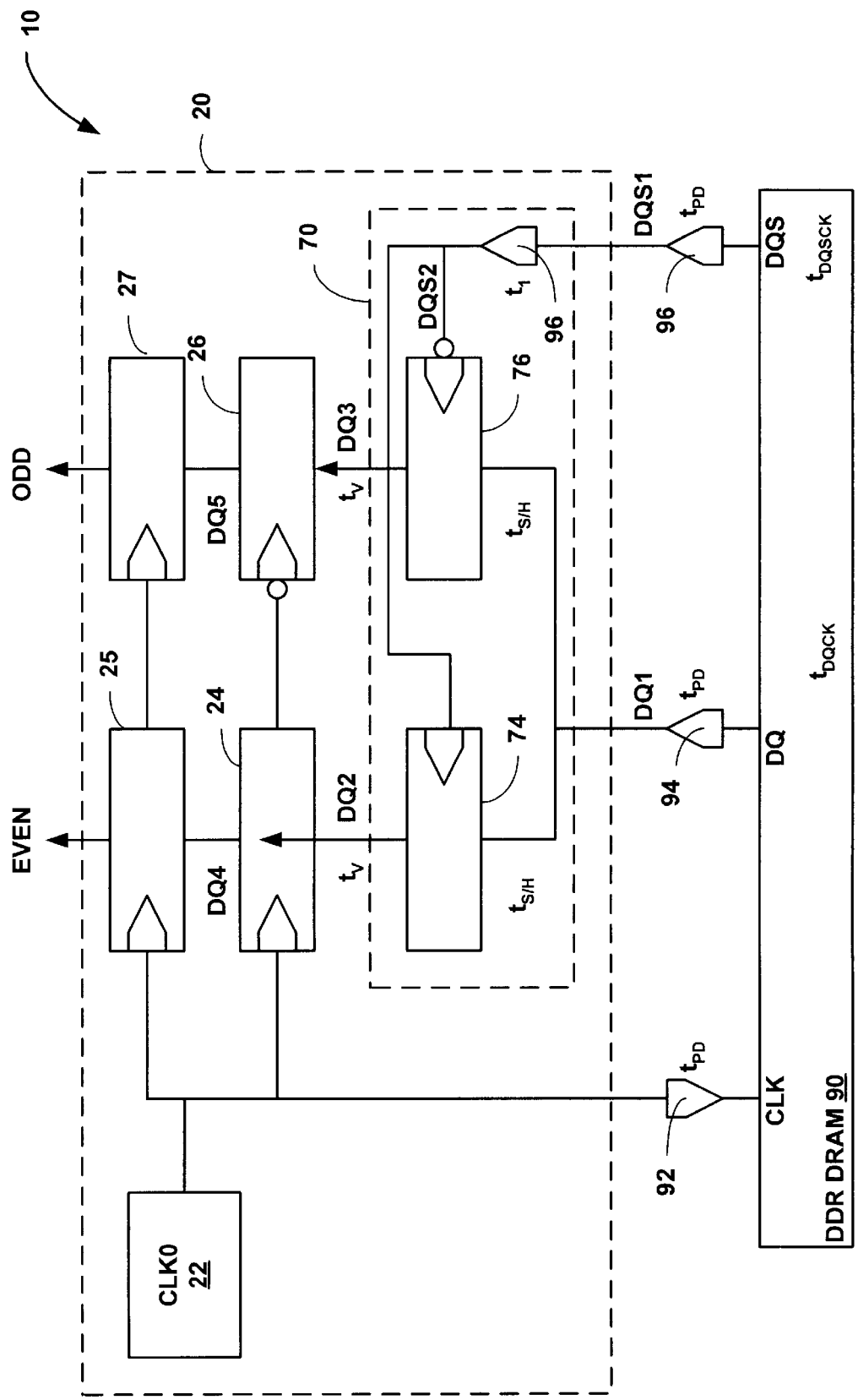
FIG. 1 is a simplified functional block diagram illustrating an example of a conventional controller for a synchronous memory device.
Figure 2:
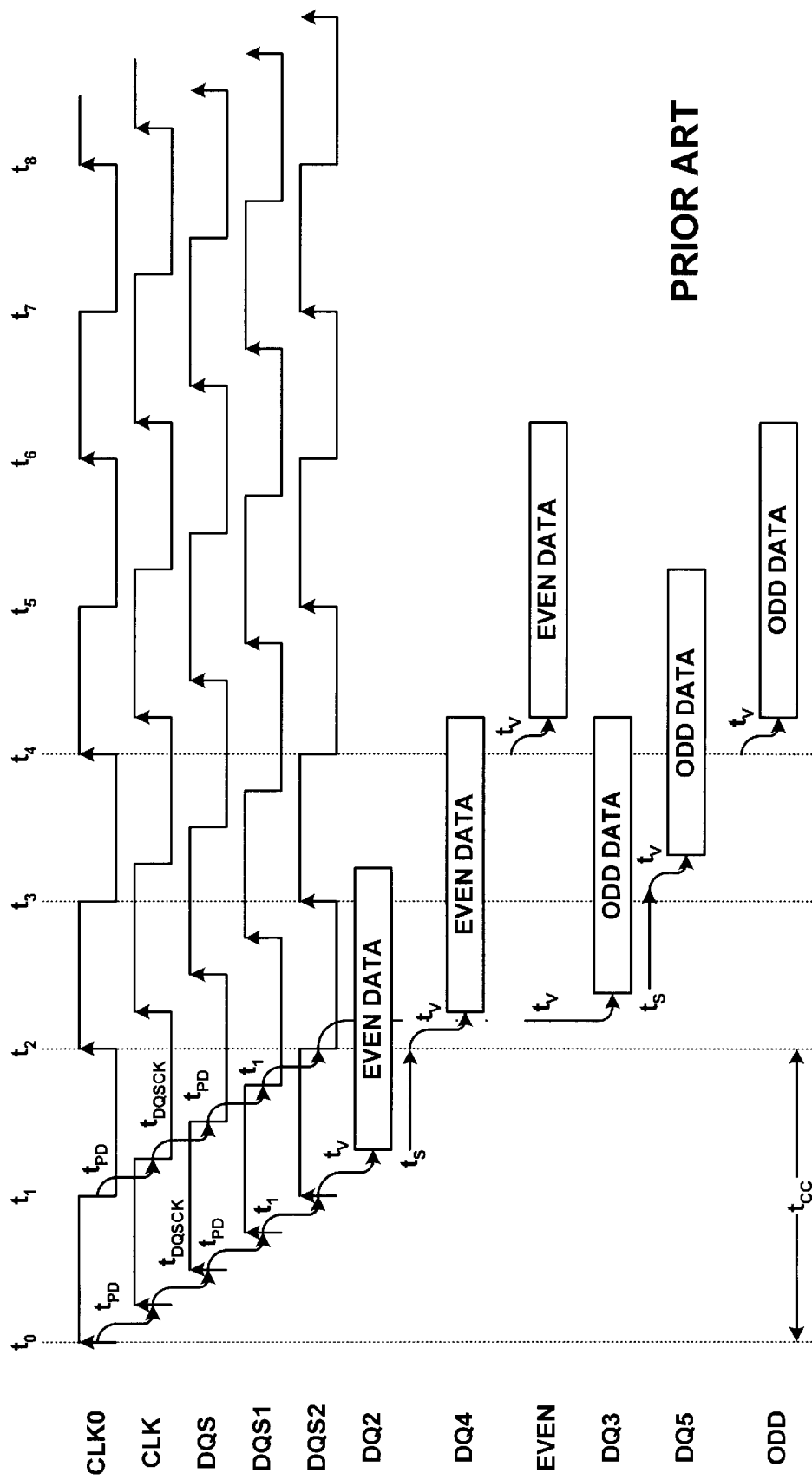
FIG. 2 is a timing diagram illustrating an example of the function of the controller of FIG. 1.
Figure 4:
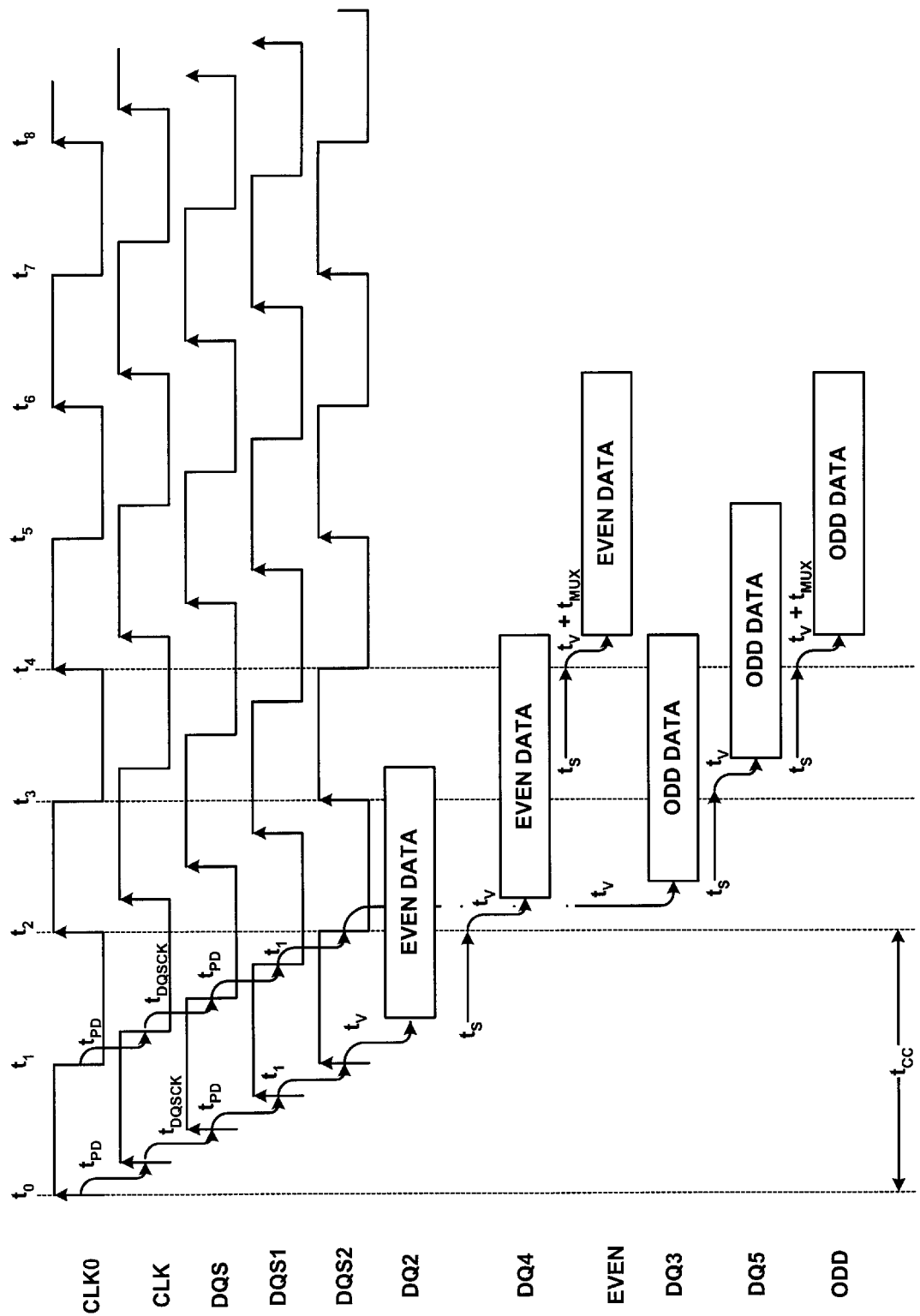
FIG. 4 is a timing diagram illustrating an embodiment of the function of the controller circuit of FIG. 3 when the MODE signal is logical 1.

FIG. 4 is a timing diagram illustrating the operation of circuit 120 of FIG. 3 when the value of the MODE signal is set to one, thereby selecting an even data path for DQ2 through registers 136 and 138 and an odd data path for DQ3 through registers 146 and 148. When MODE=1, then the function of controller 120 is similar to that of the conventional device as illustrated in the timing diagram of FIG. 2. When MODE=1, the even path for DQ2 through register 136 and 138 to MUX 130 is selected and the data from the DQ2 signal is latched at the first rising edge of the second clock cycle of CLK0. At the same time, the odd data path for DQ3 through registers 146 and 148 and to MUX 140 is selected and the DQ3 signal is latched into register 148 at the first falling edge of the CLK0 signal after the falling edge of the DQS2 signal. The addition of MUXes 130 and 140 results in an additional MUX delay time $t_{MUx}$ in addition to a register output validation time $t_v$.

Figure 5:
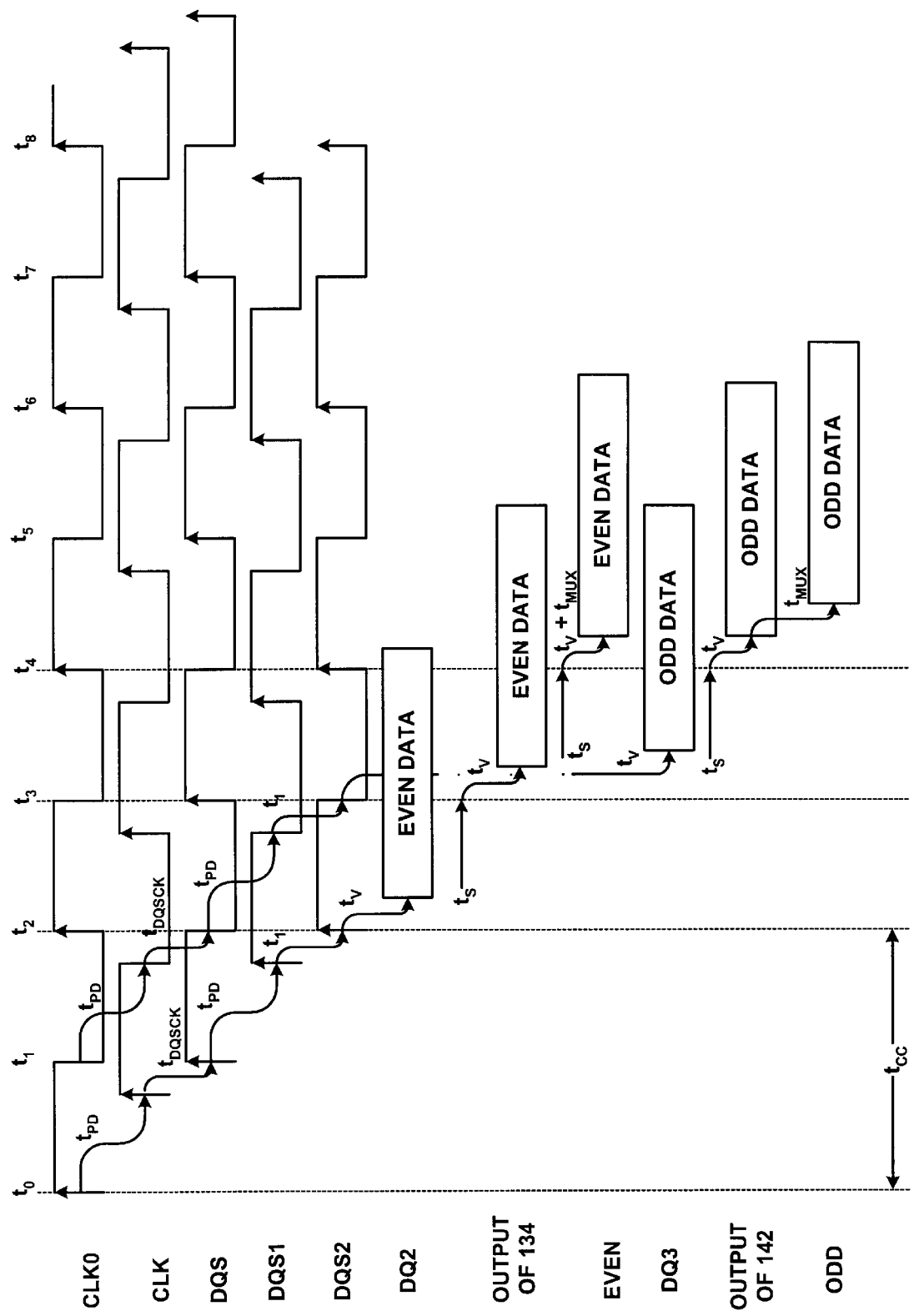
FIG. 5 is a timing diagram illustrating an embodiment of the function of the controller circuit of FIG. 3 when the MODE signal is logical 0.

FIG. 5 is a timing diagram illustrating the operation of circuit 120 of FIG. 3 when the value of the MODE signal is set to zero, thereby selecting an even data path for DQ2 through registers 132 and 134 and an odd data path for DQ3 through register 142. As can be seen from FIG. 5, the DQ2 signal output by sample and hold register 174 is latched by register 134 on the falling edge of the second cycle of the CLK0 signal and subsequently latched on the rising edge of the CLK0 signal by register 132, thereby holding the DQ2 signal for an additional half a clock cycle before being output on the even line.

The DQ3 signal output from sample and hold register 176 is latched by register 142 and made available on the ODD signal output from MUX 140 one half clock cycle after the DQ2 signal is available on the EVEN output of the MUX 130.

When operating in MODE=0, the set-up time is described by equation (3) below:

$$t_{S,min} <= t_{CC,min} + t_{CC,half} - t_{PD,max} - t_{DQSCK,max} - t_{PD,max} - t_{1,max} - t_{V,max} \quad (3)$$

which, when the numbers used in the example above are used to reduce the equation, yields:

$$0.2 \text{ ns} <= 7.5 \text{ ns} + 3.375 \text{ ns} - t_{PD,max} - 0.75 \text{ ns} - t_{PD,max} - 1.8 \text{ ns} - 0.25 \text{ ns},$$

and, $$t_{PD,max} <= 3.938 \text{ ns},$$

which represents a significantly larger propagation delay that may be handled by the memory system of FIG. 3, as illustrated in the longer propagation delays $t_{PD}$ shown in FIG. 5. Note that the MUX delays for MUX 130 and 140 are omitted in the interest of simplicity.

However, the hold time requirements are also affected by the selectable delay circuitry of FIG. 3. Equation (2) above becomes equation (4) below:

$$t_{H,min} <= t_{PD,min} + t_{DQSCK,min} + t_{PD,min} + t_{1,min} + t_{V,min} - t_{CC,half} \quad (4)$$

Plugging in typical values for these time intervals yields:

$$0.2 \text{ ns} <= t_{PD,min} + 0.75 \text{ ns} + t_{PD,min} + 0.7 \text{ ns} + 0 \text{ ns} - 4.125 \text{ ns}$$

Which reduces to:

$$2.338 \text{ ns} <= t_{PD,min}$$

Thus, the propagation delay that may be accommodated in MODE=0 must be in the range of 2.338 ns<=$t_{PD}$<=3.938 ns in order for the memory system to operate correctly. The embodiment for a memory controller 120 according to the present invention is able to accommodate greater propagation delay through the round trip between the CLK0 signal being received by DRAM device 90 and the DQ1 and DQS2 being received back from the DRAM device. However, controller 120 leaves a gap between the propagation delays that may be accommodated when MODE=0 and MODE=1.

Figure 6:
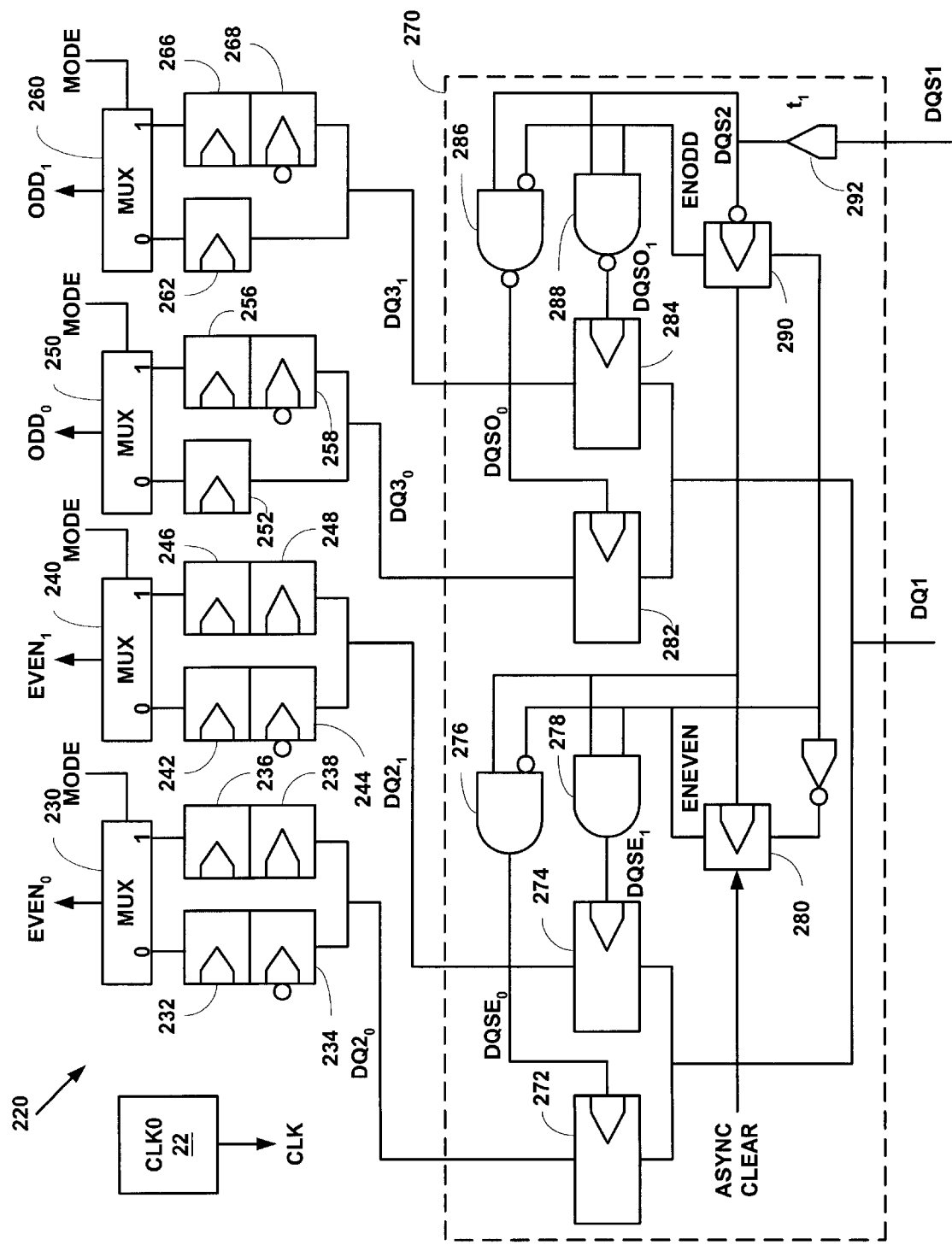
FIG. 6 is a functional block diagram illustrating another embodiment of a controller circuit for a synchronous memory according to the present invention.

FIG. 6 is a simplified functional block diagram illustrating another embodiment of the controller circuit, according to the present invention, for controlling a synchronous memory device. In controller 220 of FIG. 5, the DQ1 signal is divided by DQS domain circuit 270 into a pair of even data signals $DQ2_0$ and $DQ2_1$, latched by synchronous source signals $DQSE_0$ and $DQSE_1$, respectively, and a pair of odd data signals $DQ3_0$ and $DQ3_1$, latched by synchronous source signals $DQSO_0$ and $DQSO_1$, respectively.

A first even MUX 230 outputs a signal $EVEN_0$ received from one of two data paths for $DQ2_0$, where the MODE signal selects between a first $EVEN_0$ data path through registers 232 and 234 and the second $EVEN_0$ data path through registers 236 and 238. The second even MUX 240 outputs an $EVEN_1$, signal received through one of two data paths for $DQ2_1$, where the MODE signal selects between a first $EVEN_1$, data path through registers 242 and 244 and a second $EVEN_1$, data path through registers 246 and 248.

Similarly, a first odd MUX 250 outputs an $ODD_0$ signal received from one of two data paths for $DQ3_0$, where the MODE signal selects between a first $ODD_0$ data path through register 252 or a second $ODD_0$ data path through registers 256 and 258. The second odd MUX 260 outputs an $ODD_1$, signal received from one of two data paths for $DQ3_1$, where the MODE signal selections between a first $ODD_1$, data path through register 262 and a second $ODD_1$ data path through registers 266 and 268.

DQS domain circuit 270 includes multi-cycle source synchronous timing logic (gates 276 and 278, gates 286 and 288, toggle register 280 with inverter 281, and register 290) that processes the DQS1 signal in order to capture the DQ1 signal output from DRAM device 90 and produces the $DQSE_0$, $DQSE_1$, $DQSO_0$ and $DQSO_1$ signals that latch the DQ1 signal in sample and hold registers 272, 274, 282 and 284, respectively. The DQS1 signal enters the DQS domain circuit 270 through delay 292, which delays DQS1 signal by time delay $t_1$ in order to produce signal DQS2. DQS2 signal input to logic gates 276, 278, 286 and 288 and is also input to the clock inputs of registers 280 and 290. Register 280 is configured to be a toggle register that outputs an ENEVEN signal that is inverted by inverter 281 and input back to register 280. An asynchronous clear signal ASYNC is generated at initialization of the system to initialize register 280 to a known state. The ENEVEN signal is input to logic gates 276 and 278 where it is combined with the DQS2 signal in order to generate the signals $DQSE_0$ and $DQSE_1$ signals, respectively.

Note that it is assumed that the DDR DRAM 90 is a typical DDR device that only generates edges at the DQS output when there is valid read data at the DQ output. If a device is selected that operates differently, i.e. generates edges independent of valid data cycles, then the control logic in the CLK0 domain must track the state of ENEVEN output from the toggle flip-flop 280.

Register 290 captures the ENEVEN signal value output by register 280 at the falling edge of the DQS2 signal and outputs an enable odd signal ENODD. The ENODD signal is input to an inverting logic input of logic gate 286, which logically combines the ENODD and DQS2 signals to generate the $DQSO_0$ signal that drives the clock input of register 282. The ENODD signal is also logically combined with the DQS2 signal in logic gate 288 in order to produce the $DQSO_1$ signal that drives the clock input of register 284. Consequently, registers 282 and 284 capture signal DQ1 under the control of the $DQSO_0$ and $DQSO_1$ signals, respectively, in order to obtain the $DQ3_0$ and $DQ3_1$ signals that are output to the $ODD_0$ and $ODD_1$ outputs from MUXes 250 and 260, respectively.

Figure 7:
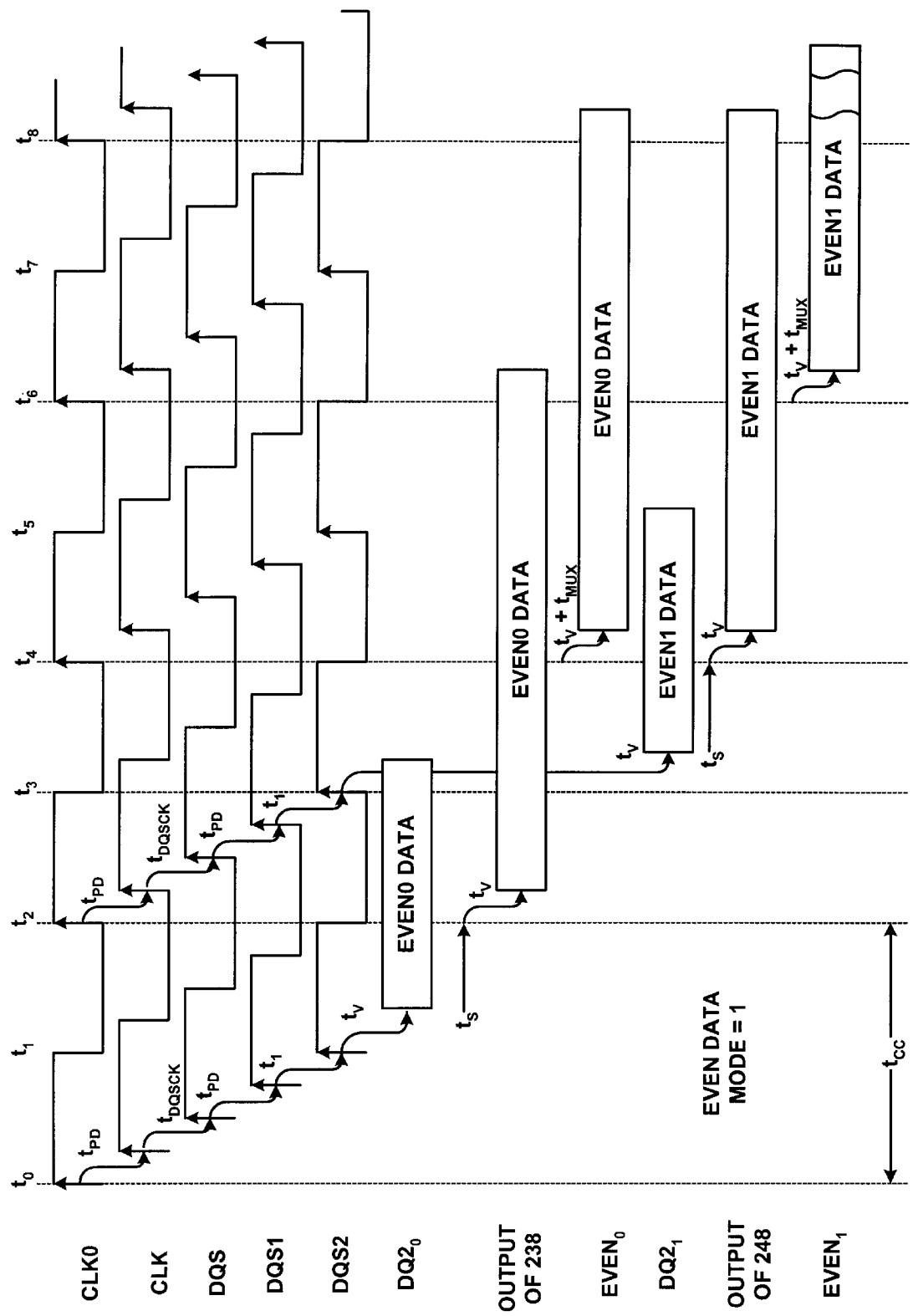
FIG. 7 is a timing diagram illustrating an embodiment of the function of the controller circuit of FIG. 6 for EVEN data when the MODE signal is logical 1.
Figure 8:
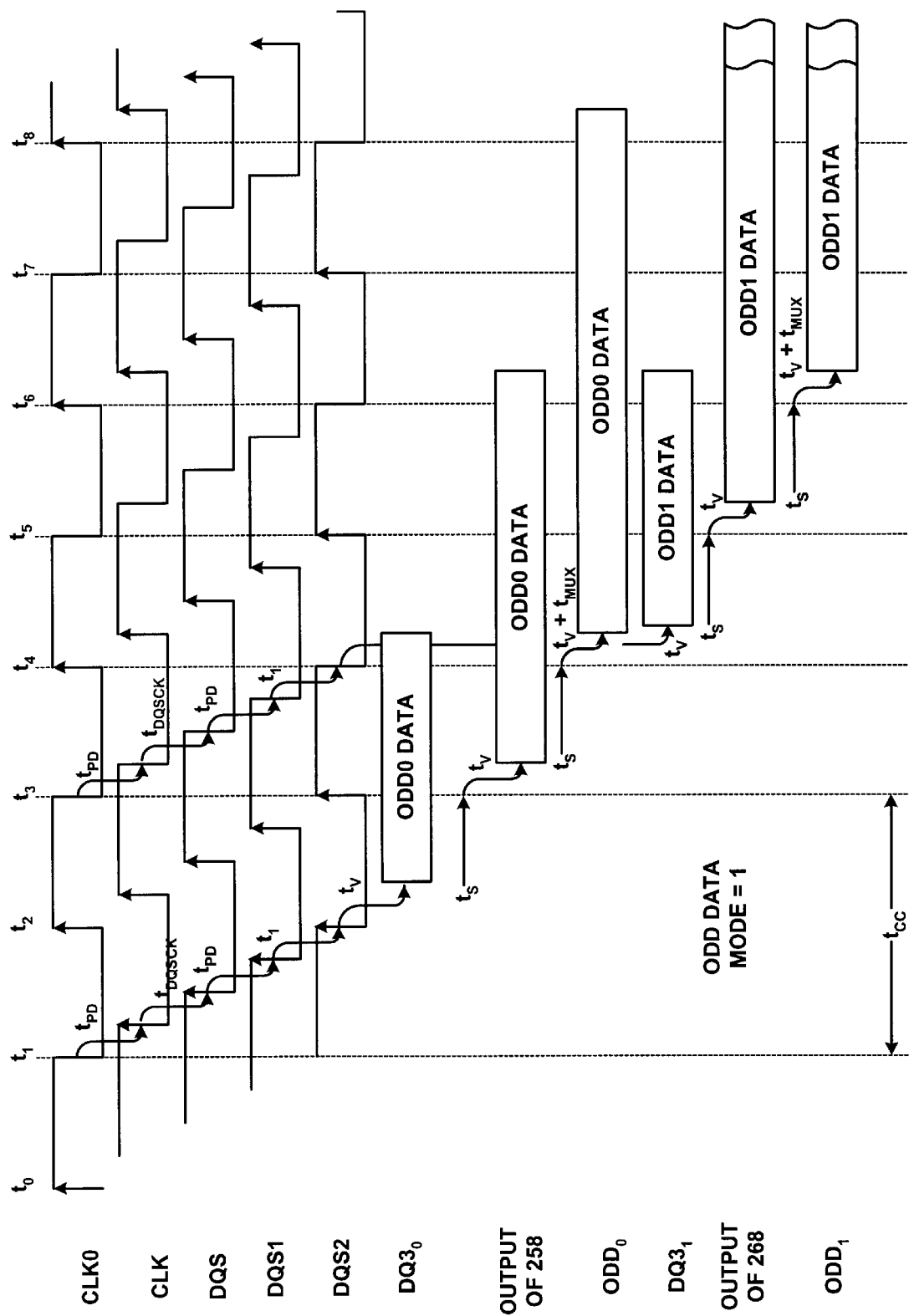
FIG. 8 is a timing diagram illustrating an embodiment of the function of the controller circuit of FIG. 6 for ODD data when the MODE signal is logical 1.
Figure 9:
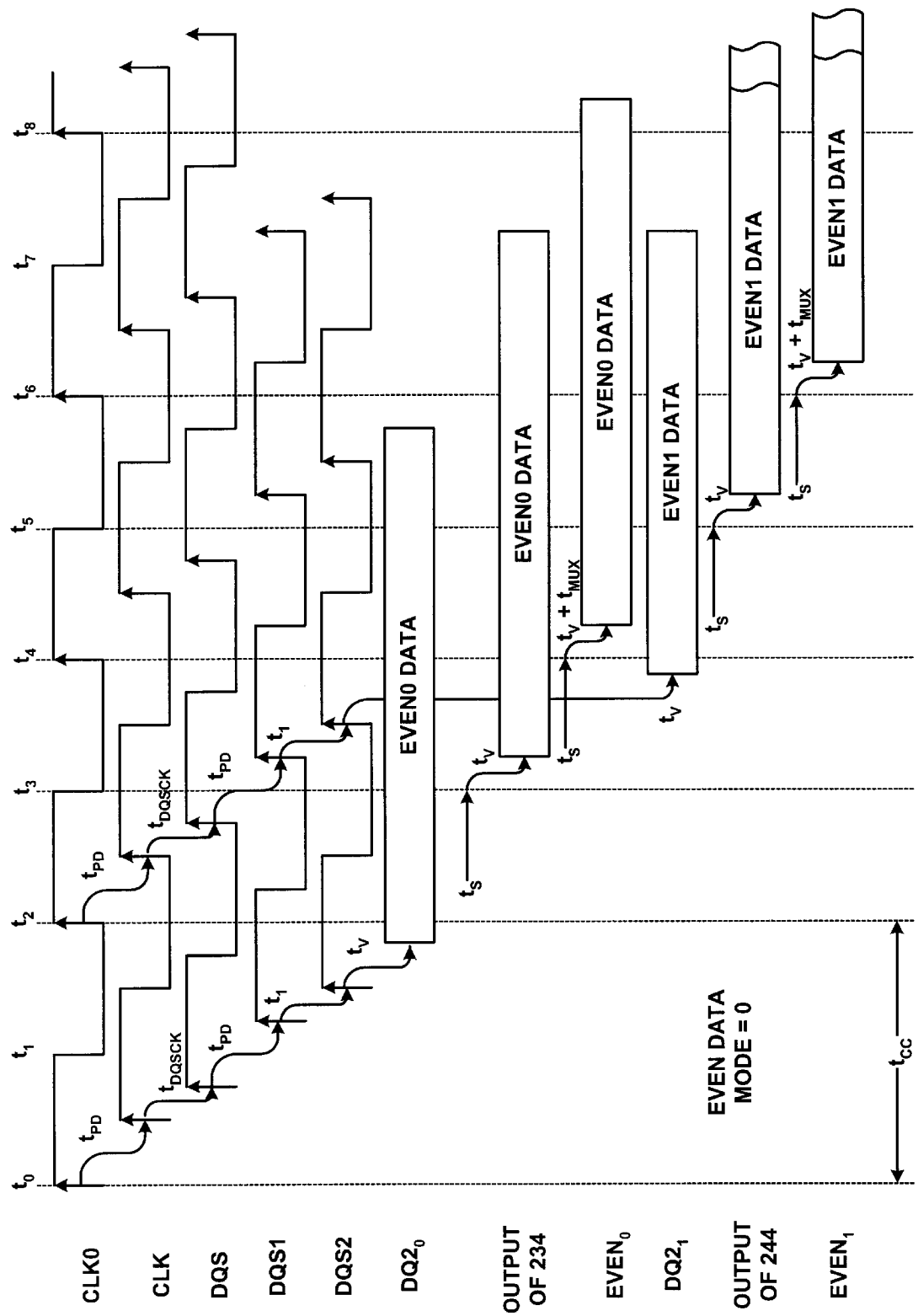
FIG. 9 is a timing diagram illustrating an embodiment of the function of the controller circuit of FIG. 6 for EVEN data when the MODE signal is logical 0.
Figure 10:
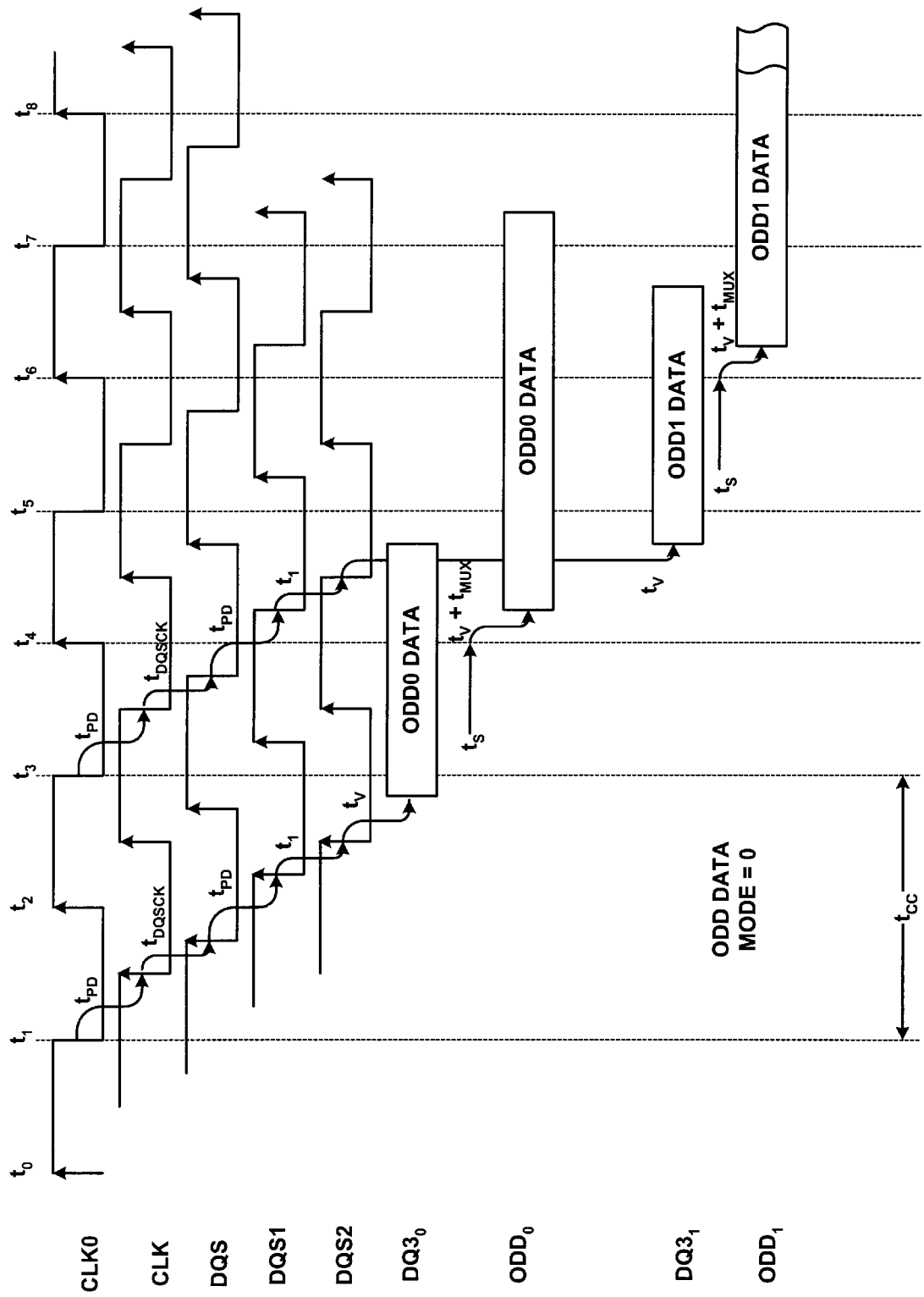
FIG. 10 is a timing diagram illustrating an embodiment of the function of the controller circuit of FIG. 6 for ODD data when the MODE signal is logical 0.

FIGS. 7 and 8 are timing diagrams illustrating the function of the controller circuit 220 of FIG. 6 when MODE=1 for EVEN and ODD data, respectively. Similarly, FIGS. 9 and 10 are timing diagrams illustrating the function of the controller circuit 220 of FIG. 6 when MODE=0 for EVEN and ODD data, respectively. When MODE=1, the $DQ2_0$ signal is latched by register 238 at the rising edge $t_2$ of the second CLK0 cycle in FIG. 7, while, when MODE=0, the $DQ2_0$ signal is latched by register 234 at the falling edge $t_3$ of the second CLK0 cycle in FIG. 9 in order to accommodate a larger relative value for $t_{PD}$. Similarly, when MODE=1, the $DQ2_1$ signal is latched by register 248 at the rising edge $t_4$ of the second CLK0 cycle in FIG. 7, while, when MODE=0, the $DQ2_1$ signal is latched by register 244 at the falling edge $t_5$ of the second CLK0 cycle in FIG. 9 in order to accommodate a larger relative value for $t_{PD}$.

Similarly, when MODE=1, the $DQ3_0$ signal is latched by register 258 at the falling edge $t_3$ of the second CLK0 cycle in FIG. 8, while, when MODE=0, the $DQ3_0$ signal is latched by register 252 at the rising edge $t_4$ of the third CLK0 cycle in FIG. 10 in order to accommodate a larger relative value for $t_{PD}$. Likewise, when MODE=1, the $DQ3_1$ signal is latched by register 268 at the falling edge $t_5$ of the third CLK0 cycle in FIG. 8, while, when MODE=0, the $DQ3_1$ signal is latched by register 262 at the rising edge $t_6$ of the fourth CLK0 cycle in FIG. 10 in order to accommodate a larger relative value for $t_{PD}$. Because the path through MUXes 250 and 260 when MODE=0 involves only one register, registers 252 and 262, respectively, the respective ODD data words are not delayed by an additional clock cycle from arriving at outputs $ODD_0$ and $ODD_1$, respectively.

Note that the timing diagrams discussed above show multiple transitions in the CLK0 signal, CLK signal and DQS signal, though the function of the controller 220 is illustrated with respect to a transition for a first data access cycle. The additional transitions pertain to additional data access cycles that are essentially the same as the first data access cycle and the response of controller 220 to these additional transitions is not addressed in order to simplify the diagrams by removing redundant material.

Figure 11:
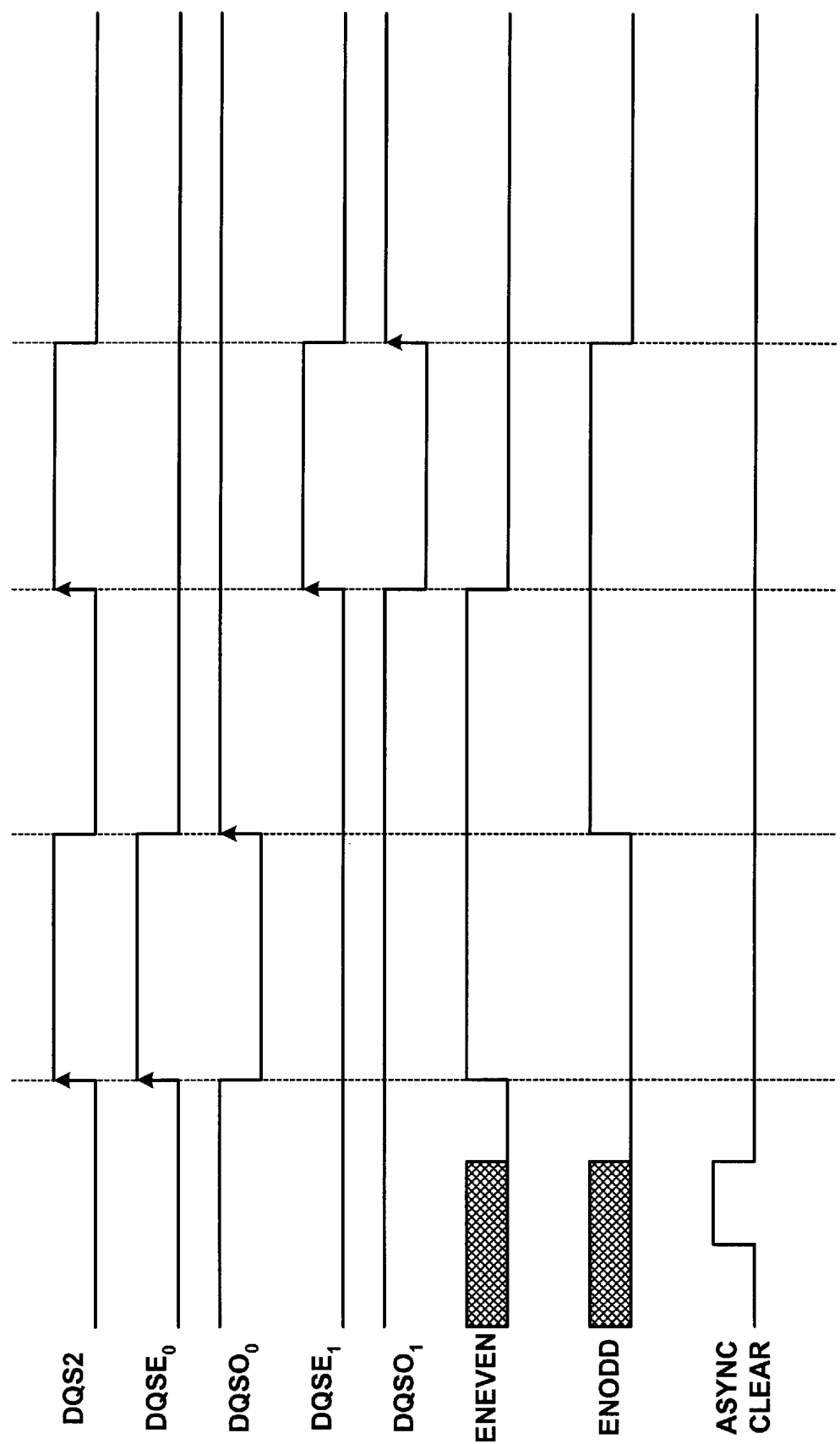
FIG. 11 is a timing diagram illustrating an embodiment of the function of the controller circuit of FIG. 6 with respect to the signals generated by an embodiment of the DQS domain circuit of FIG. 6.

FIG. 11 is a timing diagram illustrating how the multi-cycle source synchronous timing logic of DQS circuit 270 functions. Note how each rising and falling edge of the DQS2 signal results in a rising edge of one of the $DQSE_0$, $DQSE_1$, $DQSO_0$ and $DQSO_1$ signals that latch the DQ1 signal in sample and hold registers 272, 274, 282 and 284, respectively. Responsive to the first rising edge of DQS2, the $DQSE_0$ signal produces a rising edge that latches a first even word of the DQ1 signal in register 272. Responsive to the first falling edge of DQS2, the $DQSO_0$ signal produces a rising edge that latches a first odd word of the DQ1 signal in register 282. Responsive to the second rising edge of DQS2, the $DQSE_1$ signal produces a rising edge that latches a second even word of the DQ1 signal in register 274. Finally, responsive to the second falling edge of DQS2, the $DQSO_1$ signal produces a rising edge that latches a second odd word of the DQ1 signal in register 284. The ASYNC signal at initialization clears the ENEVEN signal for initial operation of the controller. The values of ENEVEN and ENODD toggle to control the function of the $DQSE_0$, $DQSE_1$, $DQSO_0$ and $DQSO_1$ signals over two cycles of the DQS2 signal.

Note that the multi-cycle source synchronous timing logic may be further refined. For example, registers 274 and 284 may be configured with inverting clock inputs driven by the $DQSE_0$ and $DQSE_1$ signals, respectively.

Unlike the circuit of FIG. 3, the controller 220 of FIG. 6 is not constrained as to the holding time because there is an additional sample and hold register for each of the even and odd data from DQ1. Each of the first and second sample and hold registers 272 and 274 for the even data latch and hold their data for an additional clock cycle, which allows the range of propagation times that can be accommodated to be larger, but also permits the operational ranges for MODE=0 and MODE=1 to overlap. This makes the transfer of data from the DQS domain to the CLK0 domain easier and scales more robustly with increasing clock frequency. As before, the valid range for $t_{PD}$ when MODE=1 is $0<=t_{PD}<=1.75$ ns. However, when MODE=0, the valid range is $0<=t_{PD}<=3.938$ ns.

It should be understood that the programs, processes, methods, systems and apparatus described herein are not related or limited to any particular type of computer apparatus (hardware or software), unless indicated otherwise. Various types of general purpose or specialized computer apparatus may be used along with the present invention or perform operations in accordance with the teachings described herein.

In view of the wide variety of embodiments to which the principles of the invention can be applied, it should be understood that the illustrated embodiments are exemplary only, and should not be taken as limiting the scope of the present invention. For example, further refinements to the multi-cycle source synchronous timing logic may be made, and more or fewer elements or components may be used in the logic, as well as different components without departing from the spirit of the present invention. For another example, the controller may be adapted to substitute the edge-triggered registers shown in the drawings with level sensitive latches. In addition, the present invention can be practiced with hardware, or a combination of hardware and software.

It should be further noted that the CLK0 domain registers of the present invention may be "pushed-through" or positioned downstream from the multiplexors in a configuration that reduces the number of registers and, therefore, the number of gates required to implement the present invention. With respect to FIG. 3, registers 132 and 136 may be combined into a single register positioned at the output of MUX 130. Likewise, registers 142 and 146 may be combined into a single register positioned at the output of MUX 140. Similarly, with respect to FIG. 6, registers 232 and 236 may be combined into a single register at the output of MUX 230, registers 242 and 246 may be combined into a single register at the output of MUX 240, registers 252 and 256 may be combined into a single register at the output of MUX 250, and registers 262 and 266 may be combined into a single register at the output of MUX 260. When the CLK0 registers are pushed-through the multiplexors, then the MODE signal must be valid one clock cycle earlier than the logic configurations illustrated in FIGS. 3 and 6. Thus, the configurations of FIGS. 3 and 6 have greater margin for error with regard to the timing limitations of the circuit because the variation in the delay introduced by the MUX is dealt with in a separate clock cycle and does not need to be handled downstream.

Furthermore, while the present invention is discussed above in the context of accommodating longer propagation delay times, it may also be applied to accommodating shorter propagation delay times. For example, while the discussion above addresses moving the sample point for a first word of even data from $t_2$ to $t_3$ by changing the MODE signal from logic 1 to logic 0, such as between FIGS. 4 and 5 and between FIGS. 7 and 9, the same approach may be used to move the sample point from $t_2$ to $t_1$. If the magnitude of $t_{PD}$ is sufficiently small that the EVEN data is valid within at least a set-up interval $t_s$ before $t_1$, then the present invention may be used to capture the EVEN data word at $t_1$ when MODE=0. However, the controller receiving the data output from the MUXes must have its timing adjusted to receive the data word when it is available from the outputs of the devices 120 and 220 according to the present invention.

The claims should not be read as limited to the described order or elements unless stated to that effect. Therefore, all embodiments that come within the scope and spirit of the following claims and equivalents thereto are claimed as the invention.

I claim:

1. A method for transferring data from a first timing domain to a second timing domain, the method comprising the steps of:

selecting a first mode value when a time delay between the first and second domains is within a first range;

selecting a second mode value when the time delay is within a second range;

sending a clock signal from the first timing domain to an asynchronous memory device, the clock signal having a first transition from a first logic state to a second logic state of the clock signal;

responsive to the first transition of the clock signal, receiving from the memory device a first data signal and a first timing signal;

capturing in the second timing domain a first word of the first data signal responsive to a first transition in the first timing signal from a first logic state to a second logic state of the first timing signal;

when the first mode value is selected, transferring the first word from the second timing domain to the first timing domain at a second transition of the clock signal from the first logic state to the second logic state; and when the second mode value is selected, transferring the first word from the second timing domain to the first timing domain at a third transition of the clock signal from the second logic state to the first logic state, where the third transition is subsequent to the second transition.

2. The method of claim 1, where:
the method further includes the step of capturing in the second timing domain a second word of the first data signal responsive to a second transition in the first timing signal from the second logic state to the first logic state of the first timing signal;
the step of, when the first mode value is selected, transferring the first word from the second timing domain to the first timing domain at a second transition of the clock signal further includes transferring the second word from the second timing domain to the first timing domain at the third transition of the clock signal from the second logic state to the first logic state; and
the step of, when the second mode value is selected, transferring the first word from the second timing domain to the first timing domain at a third transition of the clock signal further includes transferring the second word from the second timing domain to the first timing domain at a fourth transition of the clock signal from the first logic state to the second logic state, where the fourth transition is subsequent to the third transition.

3. The method of claim 1, the method further including the steps of:
capturing in the second timing domain a second word of the first data signal responsive to a second transition in the first timing signal from the second logic state to the first logic state;
capturing in the second timing domain a third word of the first data signal responsive to a third transition in the first timing signal from the first logic state to the second logic state;
capturing in the second timing domain a fourth word of the first data signal responsive to a fourth transition in the first timing signal from the second logic state to the first logic state;
the step of, when the first mode value is selected, transferring the first word from the second timing domain to the first timing domain at a second transition of the clock signal further includes,
  transferring the second word from the second timing domain to the first timing domain at the third transition of the clock signal,
  transferring the third word from the second timing domain to the first timing domain at a fourth transition of the clock signal from the first logic state to the second logic state, where the fourth transition is subsequent to the third transition, and
  transferring the fourth word from the second timing domain to the first timing domain at a fifth transition of the clock signal from the second logic state to the first logic state, where the fifth transition is subsequent to the fourth transition; and
the step of, when the second mode value is selected, transferring the first word from the second timing domain to the first timing domain at a third transition of the clock signal further includes:
  transferring the second word from the second timing domain to the first timing domain at the fourth transition of the clock signal,
  transferring the third word from the second timing domain to the first timing domain at the fifth transition of the clock signal, and
  transferring the fourth word from the second timing domain to the first timing domain at a sixth transition of the clock signal from the first logic state to the second logic state of the clock signal, where the sixth transition is subsequent to the fifth.

4. A memory controller for reading data from an asynchronous memory device, the controller comprising:
clock generation means for generating a clock signal in a first timing domain for output to the asynchronous memory device;
second timing domain means for receiving a data output signal and first timing signal from the asynchronous memory device, the second timing domain means being configured to capture a first word of the data output signal responsive to a first transition in the first timing signal from a first logic state to a second logic state of the first timing signal;
a first data path for the first word in the first timing domain for latching the first word from the second timing domain means responsive to a first transition of the clock signal from a first logic state to a second logic state;
a second data path for the first word in the first timing domain for latching the first word from the second timing domain means responsive to a second transition of the clock signal from the second logic state to the first logic state, where the second transition of the clock signal is subsequent to the first transition of the clock signal; and
means for selecting the first data path for the first word for output of the first word responsive to a first mode value and selecting the second data path for the first word for output of the first word responsive to a second mode value.

5. The memory controller of claim 4, where:
the second timing domain means further comprises means for capturing the first word, a second word, a third word, and a fourth word of the data output signal responsive to a series of four transitions of the first timing signal beginning with the first transition of the first timing signal; and
where the memory controller further includes:
a first data path for the second word in the first timing domain for latching the second word from the second timing domain means responsive to the second transition of the clock signal;
a second data path for the second word in the first timing domain for latching the second word from the second timing domain means responsive to a third transition of the clock signal from the first logic state to the second logic state, where the third transition of the clock signal is subsequent to the second transition;
a first data path for the third word in the first timing domain for latching the third word from the second timing domain means responsive to the third transition of the clock signal;
a second data path for the third word in the first timing domain for latching the third word from the second timing domain means responsive to a fourth transition of the clock signal from the second logic state to the first logic state, where the fourth transition of the clock signal is subsequent to the third transition;
a first data path for the fourth word in the first timing domain for latching the fourth word from the second timing domain means responsive to the fourth transition of the clock signal;
a second data path for the fourth word in the first timing domain for latching the fourth word from the second timing domain means responsive to a fifth transition of the clock signal from the first logic state to the second logic state, where the fifth transition of the clock signal is subsequent to the fourth transition;

means for selecting the first data path for the second word for output of the second word responsive to the first mode value and selecting the second data path for the second word for output of the second word responsive to the second mode value;

means for selecting the first data path for the third word for output of the third word responsive to the first mode value and selecting the second data path for the third word for output of the third word responsive to the second mode value; and means for selecting the first data path for the fourth word for output of the fourth word responsive to the first mode value and selecting the second data path for the fourth word for output of the fourth word responsive to the second mode value.

6. A memory controller for controlling transfer of data from an asynchronous memory device, the controller comprising:

a clock generation circuit configured to generate a clock signal for a first timing domain, where the clock signal is output to the memory device;

a second domain circuit configured to receive a data signal and a timing signal from the memory device and, responsive to a first transition of the timing signal, latch and hold a first word of the data signal;

a first data path for the first word configured to latch the first word from the second domain circuit responsive to a first transition of the clock signal from a first logic state to a second logic state of the clock signal;

a second data path for the first word configured to latch the first word from the second domain circuit responsive to a second transition of the clock signal from the second logic state to the first logic state of the clock signal, where the second transition of the clock signal is subsequent to the first transition of the clock signal; and a first multiplexor having a first input coupled to the first data path for the first word, a second input coupled to the second data path for the first word, and a control input configured to receive a mode signal and select the first data path for the first word responsive to a first value of the mode signal and select the second data path for the first word responsive to a second value of the mode signal.

7. The memory controller of claim 6, where:

the second domain circuit is further configured to latch and hold a second word of the data signal responsive to a second transition of the timing signal, the second transition of the timing signal being subsequent to the first; and the controller further includes:

a first data path for the second word configured to latch the second word from the second domain circuit responsive to a third transition of the clock signal from the first logic state to the second logic state of the clock signal, where the third transition of the clock signal is subsequent to the second transition of the clock signal;

a second data path for the second word configured to latch the second word from the second domain circuit responsive to the second transition of the clock signal; and a second multiplexor having a first input coupled to the first data path for the second word, a second input coupled to the second data path for the second word, and a control input configured to receive a mode signal and select the first data path for the second word responsive to the first value of the mode signal and select the second data path for the second word responsive to a second value of the mode signal.

8. The memory controller of claim 7, where:

the first data path for the first word further comprises first and second registers, the first register being responsive to transition of the clock signal from the first logic state to the second logic state of the clock signal, and the second register being responsive to transition of the clock signal from the second logic state to the first logic state of the clock signal;

the second data path for the second word further comprises third and fourth registers, both the third and fourth registers being responsive to transition of the clock signal from the first logic state to the second logic state of the clock signal;

the first data path for the second word further comprises a fifth register, the fifth register being responsive to transition of the clock signal from the first logic state to the second logic state of the clock signal; and the second data path for the second word further comprises further comprises sixth and seventh registers, the sixth register being responsive to transition of the clock signal from the first logic state to the second logic state of the clock signal, and the seventh register being responsive to transition of the clock signal from the second logic state to the first logic state of the clock signal.

9. The memory controller of claim 8, where the second domain circuit further comprises:

a first sample and hold register configured to sample and hold the data signal responsive to the first transition of the timing signal; and a second sample and hold register configured to sample and hold the data signal responsive to the second transition of the timing signal.

10. The memory controller of claim 6, where:

the first data path for the first word is further configured to output the first word responsive to transition of the clock signal from the first logic state to the second logic state of the clock signal subsequent to the first transition;

the second data path for the first word is further configured to output the first word responsive to transition of the clock signal from the first logic state to the second logic state of the clock signal subsequent to the second transition;

the second domain circuit comprises:

a first sample and hold register configured to sample and hold the data signal and output the first word to the first and second data paths for the first word, a second sample and hold register configured to sample and hold the data signal and output a second word, a third sample and hold register configured to sample and hold the data signal and output a third word, a fourth sample and hold register configured to sample and hold the data signal and output a fourth word, and timing logic configured to cause the first sample and hold register to latch responsive to the first transition of the timing signal, cause the second sample and hold register to latch responsive to a second transition of the timing signal, cause the third sample and hold register to latch responsive to a third transition of the timing signal, and cause the fourth sample and hold register to latch responsive to a fourth transition of the timing signal, where the first, second, third and fourth transitions of the timing signal are substantially consecutive; and the controller circuit further includes:

a first data path for the second word configured to latch the second word responsive to transition of the clock signal from the first state to the second state of the clock signal;

a second data path for the second word configured to latch the second word responsive to transition of the clock signal from the second state to the first state of the clock signal and output the second word responsive to subsequent transition of the clock signal from the first state to the second state of the clock signal;

a second multiplexor having a first input coupled to the first data path for the second word and a second input coupled to the second data path for the second word and a control input configured to receive the mode signal, where the second multiplexor selects the first data path for the second word responsive to the first value of the mode signal and selects the second data path for the second word responsive to the second value of the mode signal;

a first data path for the third word configured to latch the third word responsive to transition of the clock signal from the second state to the first state of the clock signal and output the third word responsive to subsequent transition of the clock signal from the first state to the second state of the clock signal;

a second data path for the third word configured to latch the third word responsive to transition of the clock signal from the first state to the second state of the clock signal and output the third word responsive to subsequent transition of the clock signal from the first state to the second state of the clock signal;

a third multiplexor having a first input coupled to the first data path for the third word and a second input coupled to the second data path for the third word and a control input configured to receive the mode signal, where the third multiplexor selects the first data path for the third word responsive to the first value of the mode signal and selects the second data path for the third word responsive to the second value of the mode signal;

a first data path for the fourth word configured to latch the fourth word responsive to transition of the clock signal from the first state to the second state of the clock signal and output the fourth word responsive to subsequent transition of the clock signal from the first state to the second state of the clock signal;

a second data path for the fourth word configured to latch the third word responsive to transition of the clock signal from the second state to the first state of the clock signal and output the fourth word responsive to subsequent transition of the clock signal from the first state to the second state of the clock signal; and a fourth multiplexor having a first input coupled to the first data path for the fourth word and a second input coupled to the second data path for the fourth word and a control input configured to receive the mode signal, where the third multiplexor selects the first data path for the fourth word responsive to the first value of the mode signal and selects the second data path for the fourth word responsive to the second value of the mode signal.

11. A method for transferring data from a first timing domain to a second timing domain, the method comprising the steps of:

selecting a first mode value when a time delay between the first and second domains is within a first range;

selecting a second mode value when the time delay is within a second range;

sending a clock signal from the first timing domain to an asynchronous memory device, the clock signal having a first transition from a first logic state to a second logic state of the clock signal;

responsive to the first transition of the clock signal, receiving from the memory device a first data signal and a first timing signal;

capturing in the second timing domain a first word of the first data signal responsive to a first transition in the first timing signal from a first logic state to a second logic state of the first timing signal;

when the first mode value is selected, transferring the first word from the second timing domain to the first timing domain at a second transition of the clock signal from the first logic state to the second logic state; and when the second mode value is selected, transferring the first word from the second timing domain to the first timing domain at a third transition of the clock signal from the second logic state to the first logic state, where the third transition precedes the second transition.

12. The method of claim 11, where:

the method further includes the step of capturing in the second timing domain a second word of the first data signal responsive to a second transition in the first timing signal from the second logic state to the first logic state of the first timing signal;

the step of, when the first mode value is selected, transferring the first word from the second timing domain to the first timing domain at a second transition of the clock signal further includes transferring the second word from the second timing domain to the first timing domain at a fourth transition of the clock signal from the second logic state to the first logic state, where the fourth transition is subsequent to the second transition; and the step of, when the second mode value is selected, transferring the first word from the second timing domain to the first timing domain at a third transition of the clock signal further includes transferring the second word from the second timing domain to the first timing domain at the second transition of the clock signal.

13. The method of claim 11, the method further including the steps of:

capturing in the second timing domain a second word of the first data signal responsive to a second transition in the first timing signal from the second logic state to the first logic state;

capturing in the second timing domain a third word of the first data signal responsive to a third transition in the first timing signal from the first logic state to the second logic state;

capturing in the second timing domain a fourth word of the first data signal responsive to a fourth transition in the first timing signal from the second logic state to the first logic state;

the step of, when the first mode value is selected, transferring the first word from the second timing domain to the first timing domain at a second transition of the clock signal further includes, transferring the second word from the second timing domain to the first timing domain at a fourth transition of the clock signal from the second logic state to the first logic state, where the fourth transition is subsequent to the second transition, transferring the third word from the second timing domain to the first timing domain at a fifth transition of the clock signal from the first logic state to the second logic state, where the fifth transition is subsequent to the fourth, and transferring the fourth word from the second timing domain to the first timing domain at a sixth transition of the clock signal from the second logic state to the first logic state, where the sixth transition is subsequent to the fifth transition; and the step of, when the second mode value is selected, transferring the first word from the second timing domain to the first timing domain at a third transition of the clock signal further includes:

transferring the second word from the second timing domain to the first timing domain at the second transition of the clock signal, transferring the third word from the second timing domain to the first timing domain at the fourth transition of the clock signal, and transferring the fourth word from the second timing domain to the first timing domain at the fifth transition of the clock signal.

14. A memory controller for reading data from an asynchronous memory device, the controller comprising:

clock generation means for generating a clock signal in a first timing domain for output to the asynchronous memory device;

second timing domain means for receiving a data output signal and first timing signal from the asynchronous memory device, the second timing domain means being configured to capture a first word of the data output signal responsive to a first transition in the first timing signal from a first logic state to a second logic state of the first timing signal;

a first data path for the first word in the first timing domain for latching the first word from the second timing domain means responsive to a first transition of the clock signal from a second logic state to a first logic state;

a second data path for the first word in the first timing domain for latching the first word from the second timing domain means responsive to a second transition of the clock signal from the first logic state to the second logic state, where the second transition of the clock signal is subsequent to the first transition of the clock signal; and means for selecting the first data path for the first word for output of the first word responsive to a first mode value and selecting the second data path for the first word for output of the first word responsive to a second mode value.

15. The memory controller of claim 14, where the means for selecting the first data path for the first word for output of the first word responsive to a first mode value and selecting the second data path for the first word for output of the first word responsive to a second mode value is further configured to select the first data path when a propagation delay between the memory controller is below a predetermined magnitude.

16. The memory controller of claim 14, where:

the second timing domain means further comprises means for capturing the first word, a second word, a third word, and a fourth word of the data output signal responsive to a series of four transitions of the first timing signal beginning with the first transition of the first timing signal; and where the memory controller further includes:

a first data path for the second word in the first timing domain for latching the second word from the second timing domain means responsive to the second transition of the clock signal;

a second data path for the second word in the first timing domain for latching the second word from the second timing domain means responsive to a third transition of the clock signal from the second logic state to the third logic state, where the third transition of the clock signal is subsequent to the second transition;

a first data path for the third word in the first timing domain for latching the third word from the second timing domain means responsive to the third transition of the clock signal;

a second data path for the third word in the first timing domain for latching the third word from the second timing domain means responsive to a fourth transition of the clock signal from the first logic state to the second logic state, where the fourth transition of the clock signal is subsequent to the third transition;

a first data path for the fourth word in the first timing domain for latching the fourth word from the second timing domain means responsive to the fourth transition of the clock signal;

a second data path for the fourth word in the first timing domain for latching the fourth word from the second timing domain means responsive to a fifth transition of the clock signal from the second logic state to the first logic state, where the fifth transition of the clock signal is subsequent to the fourth transition;

means for selecting the first data path for the second word for output of the second word responsive to the first mode value and selecting the second data path for the second word for output of the second word responsive to the second mode value;

means for selecting the first data path for the third word for output of the third word responsive to the first mode value and selecting the second data path for the third word for output of the third word responsive to the second mode value; and means for selecting the first data path for the fourth word for output of the fourth word responsive to the first mode value and selecting the second data path for the fourth word for output of the fourth word responsive to the second mode value.

17. A memory controller for controlling transfer of data from an asynchronous memory device, the controller comprising:

a clock generation circuit configured to generate a clock signal for a first timing domain, where the clock signal is output to the memory device;

a second domain circuit configured to receive a data signal and a timing signal from the memory device and, responsive to a first transition of the timing signal, latch and hold a first word of the data signal;

a first data path for the first word configured to latch the first word from the second domain circuit responsive to a first transition of the clock signal from a second logic state to a first logic state of the clock signal;

a second data path for the first word configured to latch the first word from the second domain circuit responsive to a second transition of the clock signal from the first logic state to the second logic state of the clock signal, where the second transition of the clock signal is subsequent to the first transition- of the clock signal; and a first multiplexor having a first input coupled to the first data path for the first word, a second input coupled to the second data path for the first word, and a control input configured to receive a mode signal and select the first data path for the first word responsive to a first value of the mode signal and select the second data path for the first word responsive to a second value of the mode signal.

18. The memory controller of claim 17, where:

the second domain circuit is further configured to latch and hold a second word of the data signal responsive to a second transition of the timing signal, the second transition of the timing signal being subsequent to the first; and the controller further includes:

a first data path for the second word configured to latch the second word from the second domain circuit responsive to the second transition of the clock signal;

a second data path for the second word configured to latch the second word from the second domain circuit responsive to a third transition of the clock signal from the second logic state to the first logic state of the clock signal, where the third transition of the clock signal is subsequent to the second transition of the clock signal; and a second multiplexor having a first input coupled to the first data path for the second word, a second input coupled to the second data path for the second word, and a control input configured to receive a mode signal and select the first data path for the second word responsive to the first value of the mode signal and select the second data path for the second word responsive to a second value of the mode signal.

19. The memory controller of claim 18, where:

the first data path for the first word further comprises first and second registers, the first register being responsive to transition of the clock signal from the second logic state to the first logic state of the clock signal, and the second register being responsive to transition of the clock signal from the first logic state to the second logic state of the clock signal;

the second data path for the second word further comprises third and fourth registers, both the third and fourth registers being responsive to transition of the clock signal from the first logic state to the second logic state of the clock signal;

the first data path for the second word further comprises a fifth register, the fifth register being responsive to transition of the clock signal from the first logic state to the second logic state of the clock signal; and the second data path for the second word further comprises further comprises sixth and seventh registers, the sixth register being responsive to transition of the clock signal from the second logic state to the first logic state of the clock signal, and the seventh register being responsive to transition of the clock signal from the first logic state to the second logic state of the clock signal.

20. The memory controller of claim 17, where:

the first data path for the first word is further configured to output the first word responsive to transition of the clock signal from the first logic state to the second logic state of the clock signal subsequent to the first transition;

the second data path for the first word is further configured to output the first word responsive to transition of the clock signal from the first logic state to the second logic state of the clock signal subsequent to the second transition;

the second domain circuit comprises:

a first sample and hold register configured to sample and hold the data signal and output the first word to the first and second data paths for the first word, a second sample and hold register configured to sample and hold the data signal and output a second word, a third sample and hold register configured to sample and hold the data signal and output a third word, a fourth sample and hold register configured to sample and hold the data signal and output a fourth word, and timing logic configured to cause the first sample and hold register to latch responsive to the first transition of the timing signal, cause the second sample and hold register to latch responsive to a second transition of the timing signal, cause the third sample and hold register to latch responsive to a third transition of the timing signal, and cause the fourth sample and hold register to latch responsive to a fourth transition of the timing signal, where the first, second, third and fourth transitions of the timing signal are substantially consecutive; and the controller circuit further includes:

a first data path for the second word configured to latch the second word responsive to transition of the clock signal from the first state to the second state of the clock signal;

a second data path for the second word configured to latch the second word responsive to transition of the clock signal from the second state to the first state of the clock signal and output the second word responsive to subsequent transition of the clock signal from the first state to the second state of the clock signal;

a second multiplexor having a first input coupled to the first data path for the second word and a second input coupled to the second data path for the second word and a control input configured to receive the mode signal, where the second multiplexor selects the first data path for the second word responsive to the first value of the mode signal and selects the second data path for the second word responsive to the second value of the mode signal;

a first data path for the third word configured to latch the third word responsive to transition of the clock signal from the second state to the first state of the clock signal and output the third word responsive to subsequent transition of the clock signal from the first state to the second state of the clock signal;

a second data path for the third word configured to latch the third word responsive to transition of the clock signal from the first state to the second state of the clock signal and output the third word responsive to subsequent transition of the clock signal from the first state to the second state of the clock signal;

a third multiplexor having a first input coupled to the first data path for the third word and a second input coupled to the second data path for the third word and a control input configured to receive the mode signal, where the third multiplexor selects the first data path for the third word responsive to the first value of the mode signal and selects the second data path for the third word responsive to the second value of the mode signal;

a first data path for the fourth word configured to latch the fourth word responsive to transition of the clock signal from the first state to the second state of the clock signal and output the fourth word responsive to subsequent transition of the clock signal from the first state to the second state of the clock signal;

a second data path for the fourth word configured to latch the third word responsive to transition of the clock signal from the second state to the first state of the clock signal and output the fourth word responsive to subsequent transition of the clock signal from the first state to the second state of the clock signal; and a fourth multiplexor having a first input coupled to the first data path for the fourth word and a second input coupled to the second data path for the fourth word and a control input configured to receive the mode signal, where the third multiplexor selects the first data path for the fourth word responsive to the first value of the mode signal and selects the second data path for the fourth word responsive to the second value of the mode signal.

* * * * *